United States Patent
Iida

(10) Patent No.: US 8,368,787 B2
(45) Date of Patent: Feb. 5, 2013

(54) IMAGE SENSOR, SINGLE-PLATE COLOR IMAGE SENSOR, AND ELECTRONIC DEVICE

(75) Inventor: Yoshinori Iida, Kita-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 13/047,148

(22) Filed: Mar. 14, 2011

(65) Prior Publication Data

US 2011/0164158 A1 Jul. 7, 2011

Related U.S. Application Data

(62) Division of application No. 12/049,678, filed on Mar. 17, 2008, now abandoned.

(30) Foreign Application Priority Data

Mar. 22, 2007 (JP) .................................. 2007-074879

(51) Int. Cl.
*H04N 5/335* (2011.01)
(52) U.S. Cl. ...................................... 348/294; 348/272
(58) Field of Classification Search .................. None
See application file for complete search history.

(56) References Cited

U.S. PATENT DOCUMENTS

| | | | |
|---|---|---|---|
| 6,046,771 A | 4/2000 | Horii | |
| 6,177,289 B1 | 1/2001 | Crow et al. | |
| 6,392,282 B1 | 5/2002 | Sahara et al. | |
| 6,707,075 B1 | 3/2004 | Rogers et al. | |
| 7,187,410 B2 | 3/2007 | Yamaguchi et al. | |
| 7,230,226 B2 * | 6/2007 | Inuiya | 250/208.1 |
| 7,714,292 B2 * | 5/2010 | Agarwal et al. | 250/370.01 |
| 7,760,254 B2 * | 7/2010 | Suzuki | 348/272 |
| 8,258,594 B2 * | 9/2012 | Richter et al. | 257/432 |
| 2004/0178467 A1 | 9/2004 | Lyon et al. | |
| 2005/0205930 A1 | 9/2005 | Williams, Jr. | |
| 2005/0230706 A1 | 10/2005 | Yagyu et al. | |

FOREIGN PATENT DOCUMENTS

| | | |
|---|---|---|
| JP | 5-211321 | 8/1993 |
| JP | 2000-323747 | 11/2000 |
| JP | 2002-151702 | 5/2002 |
| JP | 2002-314117 | 10/2002 |
| WO | WO 2006/135683 A2 | 12/2006 |

OTHER PUBLICATIONS

Kenkichi Tanioka, et al., "An Avalanche-Mode Amorphous Selenium Photoconductive Layer for Use as a Camera Tube Target", IEEE Electron Device Letters, vol. EDL-8, No. 9, Sep. 1987, pp. 392-394.

Yoshiro Takiguchi, et al., "A CMOS Imager Hybridized to an Avalanche Multiplied Film", IEEE Transactions on Electron Devices, vol. 44, No. 10, Oct. 1997, pp. 1783-1788.

* cited by examiner

*Primary Examiner* — Luong Y Nguyen
(74) *Attorney, Agent, or Firm* — Oblon, Spivak, McClelland, Maier & Neustadt, L.L.P.

(57) ABSTRACT

An image sensor includes an imaging area including a plurality of cells arrayed in a matrix on a semiconductor substrate, each of the cells including an avalanche photodiode, the avalanche photodiode including: an anode region buried in an upper portion of the semiconductor substrate; a cathode region buried in the upper portion of the semiconductor substrate separated from the anode region in a direction parallel to the surface of the semiconductor substrate; and an avalanche multiplication region defined between the anode and cathode regions, the avalanche multiplication region having an impurity concentration less than the anode and cathode regions; wherein depths of the anode and cathode regions from the surface of the semiconductor substrate are different from each other.

12 Claims, 13 Drawing Sheets

IMAGE SENSOR, SINGLE-PLATE COLOR IMAGE SENSOR, AND ELECTRONIC DEVICE

CROSS REFERENCE TO RELATED APPLICATIONS AND INCORPORATION BY REFERENCE

This application is a division of U.S. application Ser. No. 12/049,678 filed Mar. 17, 2008, and is based upon and claims the benefit of priority from prior Japanese patent application P2007-074879 filed on Mar. 22, 2007; the entire contents of each of which are incorporated by reference herein.

BACKGROUND OF THE INVENTION

1. Field of the Invention

The present invention relates to an image sensor, and particularly to an image sensor using an avalanche photodiode, a single-plate color image sensor and an electronic device.

2. Description of the Related Art

With an increase in the market of electronic devices, such as digital cameras, portable telephones with a built-in camera, and the like, the development of image sensors is being actively pursued. In particular, there is intensified competition in the development of a metal-oxide semiconductor (MOS) image sensor, which can be manufactured by typical semiconductor manufacturing processes, such as complementary MOS (CMOS) processes.

In the development trend to increase the number of pixels and decrease optical size of the MOS image sensors, miniaturization of a pixel size of the MOS image sensor is an important subject. A pixel size of about 2.2 μm has been achieved for a commercial product. A pixel size of about 1.7 μm has been reported at an academic conference. Moreover, many manufacturers have announced schedules for the mass production of MOS image sensors having a 1.7 μm pixel. Similarly, conventional mainstream charge-coupled device (CCD) image sensors are also advancing the development of miniaturized pixels.

In association with the miniaturization of the pixel, it is impossible to avoid a tendency of decreased sensitivity of the image sensors. That is, the area of a light sensitive element, such as a photodiode and the like, may be decreased along with the miniaturization of the pixel. Since the intensity of an incident light for each pixel is decreased, the amount of a signal electric charge, which is generated by photoelectric conversion and accumulated in a pixel, may be decreased.

As one method for obtaining a large output signal from few signal charges, a technique for multiplying the signal charges by avalanche multiplication is known. For example, an image pickup tube using an amorphous selenium (a-Se) photoconductive film for an avalanche multiplication layer has been reported (refer to Tanioka, et al., IEEE Electron Device Letters, September 1984, Vol. EDL-8, p. 392-394). Also, an image sensor stacking a-Se avalanche multiplication layers has been reported (refer to Takiguchi, et al., IEEE Transactions on Electron Device, October 1997, Vol. 44, No. 10, p. 1783).

In the document of Takiguchi, et al., a high-gain avalanche rushing amorphous photoconductor (HARP) film having a thickness of about 0.5 μm is connected to a CMOS sensor through a bump having a diameter of about 5 μm to form a hybrid image sensor. It has been reported that, by applying a voltage of about 75 V to the HARP film, a gain of about 10 times can be achieved.

However, when using the multiplication film made of the material without silicon (Si), the hybrid structure and the bump are required, as mentioned above. Thus, the use of the avalanche multiplication layer is not necessarily suitable for miniaturization of the pixel.

Furthermore, a normal avalanche multiplication layer has a longitudinal structure vertical to a semiconductor substrate surface (refer to JP-A 2000-323747 (KOKAI)). In the avalanche multiplication layer, an electrical field for generating avalanche multiplication is parallel to the incident light. A short wavelength light is absorbed in the vicinity of the semiconductor substrate surface. On the other hand, a long wavelength light is transmitted to a deeper position from the semiconductor substrate surface. As a result, the avalanche multiplication factor is different depending on the wavelength of a light absorbed in the avalanche multiplication layer. Thus, there is a problem in that a spectral sensitivity of the avalanche multiplication layer is changed.

Also, a lateral trench optical detector that can carry out a high speed response has been proposed (refer to U.S. Pat. No. 6,177,289). In U.S. Pat. No. 6,177,289, an n-type trench region and a p-type trench region are alternately formed in each of a plurality of trenches formed in a semiconductor substrate, so as to form a lateral PIN photodiode.

Furthermore, in a single-plate color image sensor, in which the three primary colors of red, green and blue (RGB) in a light are received by a single sensor, it is necessary to form a color filter above a photodiode, in order to obtain pixels having different spectral sensitivities. Because of the existence of the color filter, the distance between a photodiode surface and a micro lens may be increased. Therefore, the light collection efficiency of the micro lens may be decreased, to decrease the sensitivity.

SUMMARY OF THE INVENTION

It is an object of the present invention to provide an image sensor, which is capable of suppressing a decrease of sensitivity and change of spectral sensitivity.

A first aspect of the present invention inheres in an image sensor including an imaging area including a plurality of cells arrayed in a matrix on a semiconductor substrate, each of the cells including an avalanche photodiode, the avalanche photodiode including: an anode region buried in an upper portion of the semiconductor substrate; a cathode region buried in the upper portion of the semiconductor substrate separated from the anode region in a direction parallel to the surface of the semiconductor substrate; and an avalanche multiplication region defined between the anode and cathode regions, the avalanche multiplication region having an impurity concentration less than the anode and cathode regions; wherein depths of the anode and cathode regions from the surface of the semiconductor substrate are different from each other.

A second aspect of the present invention inheres in a single-plate color image sensor including an imaging area including a plurality of cells arrayed in a matrix on a semiconductor substrate, each of the cells including first to third avalanche photodiodes, each of the first to third avalanche photodiodes respectively including: first to third anode regions buried in an upper portion of the semiconductor substrate; first to third cathode regions buried in the upper portion of the semiconductor substrate separated from each of the first to third anode regions in a direction parallel to the surface of the semiconductor substrate; and first to third avalanche multiplication regions defined between each of the first to third anode regions and each of the first to third cathode regions, each of the first to third avalanche multiplication regions having an impurity concentration less than each of the first to third anode and each of the first to third cathode regions; wherein, for at least one of the first to third avalanche photodiodes, depths of each of the first to third anode regions and each of the first to third cathode regions from the surface of the semiconductor substrate are different from each other.

A third aspect of the present invention inheres in an electronic device having a camera module in which an image sensor is installed, the image sensor including an imaging area including a plurality of cells arrayed in a matrix on a semiconductor substrate, each of the cells including an avalanche photodiode, the avalanche photodiode including: an anode region buried in an upper portion of the semiconductor substrate; a cathode region buried in the upper port ion of the semiconductor substrate separated from the anode region in a direction parallel to the surface of the semiconductor substrate; and an avalanche multiplication region defined between the anode region and the cathode region, the avalanche multiplication region having an impurity concentration less than the anode and cathode regions; wherein depths of the anode and cathode regions from the surface of the semiconductor substrate are different from each other.

A fourth aspect of the present invention inheres in an electronic device having a camera module in which a single-plate color image sensor is installed, the single-plate color image sensor including an imaging area including a plurality of cells arrayed in a matrix on a semiconductor substrate, each of the cells including first to third avalanche photodiodes, each of the first to third avalanche photodiodes respectively including: first to third anode regions buried in an upper portion of the semiconductor substrate; first to third cathode regions buried in the upper portion of the semiconductor substrate separated from each of the first to third anode regions in a direction parallel to the surface of the semiconductor substrate; and first to third avalanche multiplication regions defined between each of the first to third anode regions and each of the first to third cathode regions, each of the first to third avalanche multiplication regions having an impurity concentration less than each of the first to third anode and each of the first to third cathode regions; wherein, for at least one of the first to third avalanche photodiodes, depths of each of the first to third anode regions and each of the first to third cathode regions from the surface of the semiconductor substrate are different from each other.

DETAILED DESCRIPTION OF THE INVENTION

Figure 1:
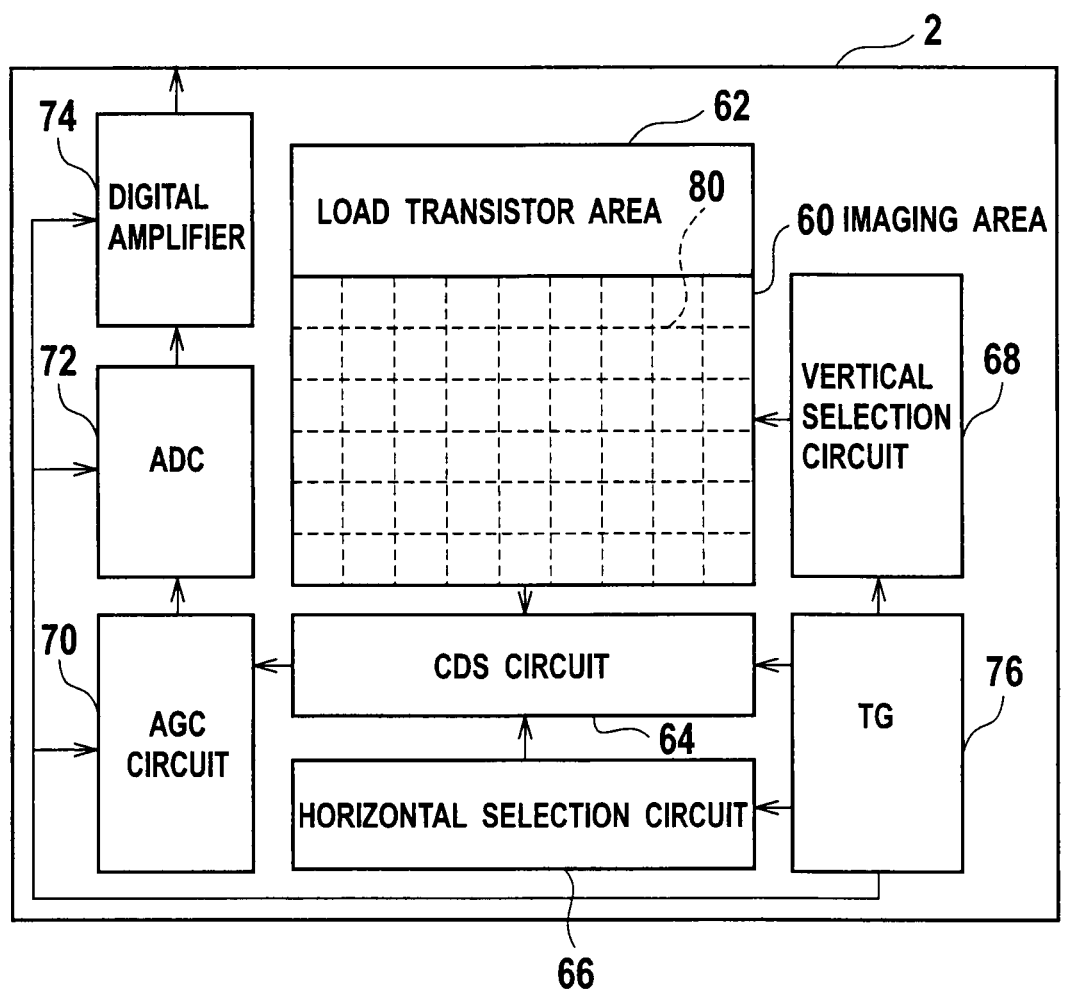
FIG. 1 is a schematic view showing an example of an image sensor according to a first embodiment of the present invention.

Various embodiments of the present invent ion will be described with reference to the accompanying drawings. It is to be noted that the same or similar reference numerals are applied to the same or similar parts and elements throughout the drawings, and the description of the same or similar parts and elements will be omitted or simplified.

First Embodiment

An image sensor 2 according to a first embodiment of the present invention includes an imaging area 60, a load transistor area 62, a correlated double sampling (CDS) circuit 64, a horizontal selection circuit 66, a vertical selection circuit 68, an automatic gain control (AGC) circuit 70, an analog-digital converter (ADC) 72, a digital amplifier 74 and a timing generator (TG) 76. The imaging area 60 includes a plurality of cells 80, arrayed in a matrix. Each of the plurality of cells 80 functions as a pixel and converts a signal charge, generated from an incident light signal by photoelectric conversion, to a voltage so as to generate an analog signal. The load transistor area 62 is arranged in contact with the imaging area 60. The load transistor area 62 includes a source follower circuit provided in combination with an amplifying transistor of a pixel selected by the vertical selection circuit 68, so as to transmit the analog signal voltage, which is generated by each pixel, to the CDS circuit 64 from the imaging area 60.

The CDS circuit 64 is connected to each of the plurality of cells 80 and decreases noise of the analog signal generated by photoelectric conversion in each of the plurality of cells 80. The vertical selection circuit 68 selects a target cell 80 in a row direction of the cell matrix from the plurality of cells 80 arrayed in the imaging area 60, as mentioned above. The horizontal selection circuit 66 selects the pixel signals in one column of the cell matrix, which are held in the CDS circuit 64, and sequentially transmits the selected pixel signals in a time series.

The AGC circuit 70 adjusts the analog signal from the CDS circuit 64 to a moderate gain. The ADC 72, connected to the AGC circuit 70, converts the analog signal adjusted the gain to a digital signal. The digital amplifier 74, connected to the ADC 72, transmits the converted digital signal to an external signal processor (DSP) (not shown). The TG 76 generates a timing pulse (clock signal) to drive the horizontal selection circuit 66, the vertical selection circuit 68, the CDS circuit 64, the AGC circuit 70, the ADC 72 and the digital amplifier 74. Specifically, the clock signal synchronizes timing of the AGC circuit 70 and the ADC 72 to select a target cell among the plurality of cells 80.

The image sensor 2 shown in FIG. 1 has a 1-chip configuration integrated on one semiconductor substrate. In addition, the ADC 72 may be combined with the CDS circuit 64 in a column-type CDS-ADC circuit. Also, it is possible to omit the AGC circuit 70, the ADC 72, the digital amplifier 74, or the TG 76, as needed. Moreover, a 2-chip configuration may be used by forming any one or all of the AGC circuit 70, the ADC 72, the digital amplifier 74 and the TG 76 on a different chip.

Figure 2:
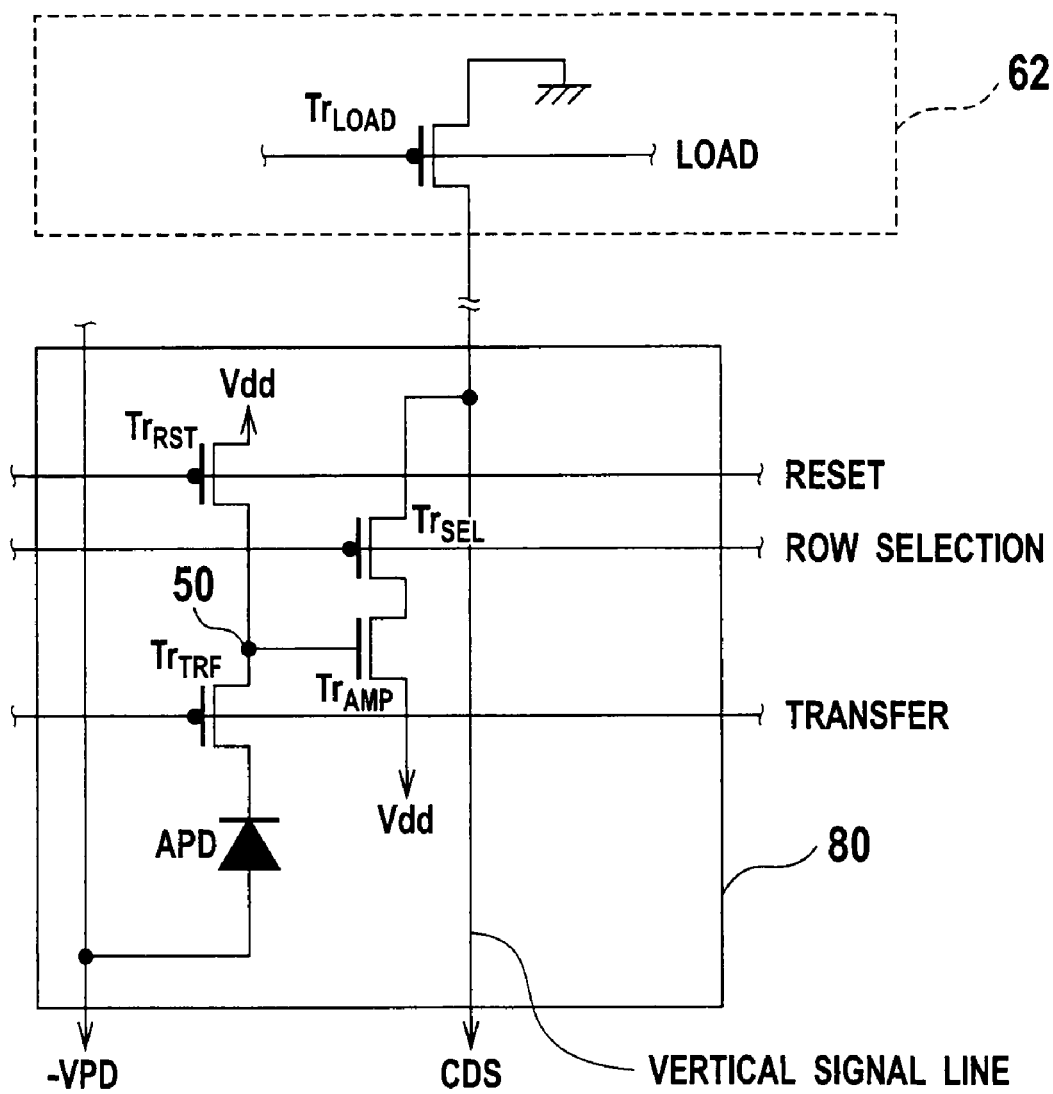
FIG. 2 is a schematic view showing an example of a circuit of a cell in the image sensor according to the first embodiment of the present invention.

As shown in FIG. 2, each of the plurality of cells 80 has an avalanche photodiode APD and a plurality of n-type insulated-gate field effect transistors, such as n-type metal-oxide semiconductor (n-MOS) transistors having a $SiO_2$ gate insulating film, and n-type metal-insulator semiconductor (n-MIS) transistors having an insulating gate film such as $Si_3N_4$, $Al_2O_3$, $HfO_2$, and ONO, to form a unit pixel. In the description described below, for the insulated-gate field effect transistors, n-MOS transistors are used. The n-MOS transistors include a transfer transistor $Tr_{TRF}$, a reset transistor $Tr_{RST}$, an amplifying transistor $Tr_{AMP}$, a selection transistor $Tr_{SEL}$ and the like. The load transistor area 62 includes a load transistor $Tr_{LOAD}$ which is commonly connected to each cell 80 arrayed in the row direction of the plurality of cells 80.

The anode of the avalanche photodiode APD implementing the photoelectric conversion is connected to an anode wiring which supplies an applied voltage (−VPD) from a power source (not shown) external to the imaging area 60. The cathode of the avalanche photodiode APD is connected to the source region of the transfer transistor $Tr_{TRF}$. The gate of the transfer transistor $Tr_{TRF}$ is connected to a transfer signal line. The drain region of the transfer transistor $Tr_{TRF}$ is connected to the source region of the reset transistor $Tr_{RST}$. The gate of the reset transistor $Tr_{RST}$ is connected to a reset signal line. The drain region of the reset transistor $Tr_{RST}$ is connected to a power source voltage wiring to supply a power source voltage Vdd. The drain region of the transfer transistor $Tr_{TRF}$ and the source region of the reset transistor $Tr_{RST}$, connected to each other, to serve as a sensing portion 50, which acts as a so-called floating diffusion (FD) so as to accumulate the signal charges transferred through the transfer transistor $Tr_{TRF}$, and to transmit the signal voltage converted from the signal charges.

The gate of the amplifying transistor $Tr_{AMP}$ is connected to the sensing portion 50. The drain region of the amplifying transistor $Tr_{AMP}$ is connected to the power source voltage wiring. The source region of the amplifying transistor $Tr_{AMP}$ is connected to the drain region of the selection transistor $Tr_{SEL}$. The gate of the selection transistor $Tr_{SEL}$ is connected to a row selection signal line. The source region of the selection transistor $Tr_{SEL}$ is connected to the drain region of the load transistor $Tr_{LOAD}$ through a vertical signal line connected to the CDS circuit 64 shown in FIG. 1. The gate of the load transistor $Tr_{LOAD}$ is connected to a load signal line. The source region of the load transistor $Tr_{LOAD}$ is grounded. The amplifying transistor $Tr_{AMP}$ and the selection transistor $Tr_{SEL}$ may be exchanged with each other.

The charge signal generated in the avalanche photodiode APD is transferred to the sensing portion 50 by the transfer transistor $Tr_{TRF}$. The charge signal accumulated in the sensing portion 50 is converted into the analog voltage signal by electrostatic capacitance of the FD. The source follower circuit, which is provided by the amplifying transistor $Tr_{AMP}$ and the load transistor $Tr_{LOAD}$ connected in series through the vertical signal line, transmits the analog voltage signal detected by the sensing portion 50, to the CDS circuit 64 connected through the vertical signal line.

The reset transistor $Tr_{RST}$ is turned on by a reset signal, and discharges the signal charges accumulated in the sensing portion 50 so as to reset the sensing portion 50. The selection transistor $Tr_{SEL}$ is turned on by a column selection signal, and connects the amplifying transistor $Tr_{AMP}$ and the load transistor $Tr_{LOAD}$ so as to activate the source follower circuit, provided by the amplifying transistor $Tr_{AMP}$ and load transistor $Tr_{LOAD}$ in a selected row. Also, simultaneously, the amplifying transistors $Tr_{AMP}$ in non-selected rows and the vertical signal line are electrically isolated.

In addition, in FIG. 2, all functions of photoelectric conversion, signal charge accumulation, charge-voltage conversion, source follower and the like, are provided in the cell 80 of the unit pixel. However, drain regions of a plurality of transfer transistors $Tr_{TRF}$ connected to each of a plurality of avalanche photodiodes APD may be connected to a common sensing portion 50. In this case, the reset transistor $Tr_{RST}$, the amplifying transistor $Tr_{AMP}$, and the selection transistor $Tr_{SEL}$, are shared by each transfer transistor $Tr_{TRF}$. By using such configuration, it is possible to use a configuration of two pixels in one cell, four pixels in one cell, and the like. Thus, miniaturization of the pixel may be accomplished with ease.

Figure 3:
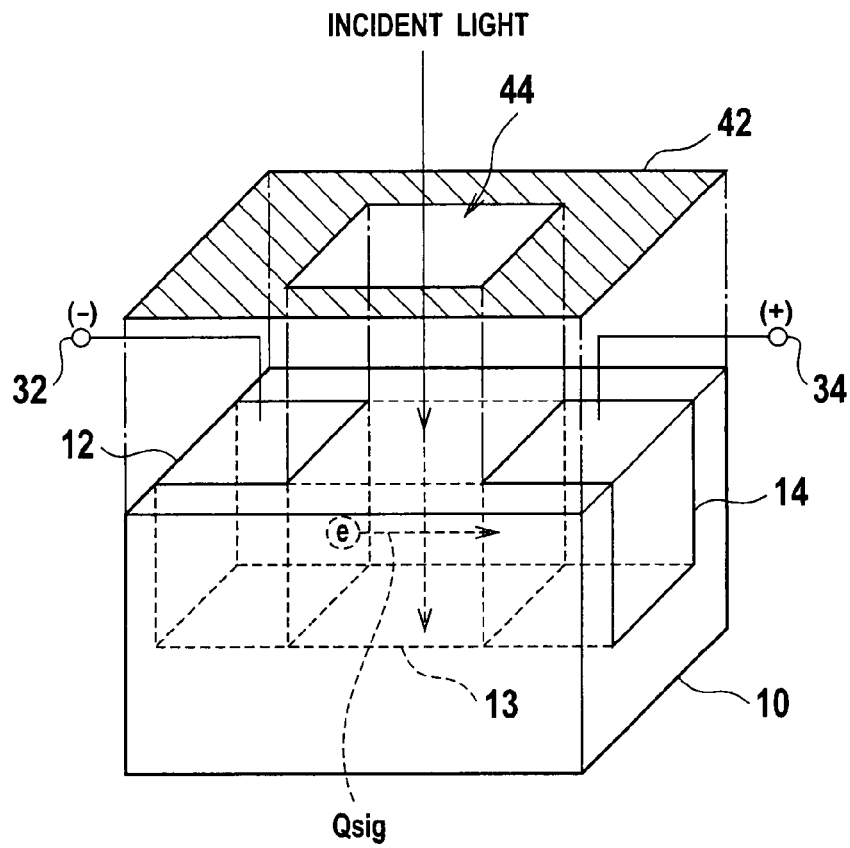
FIG. 3 is a perspective view showing an example of an avalanche photodiode used in the image sensor according to the first embodiment of the present invention.
Figure 4:
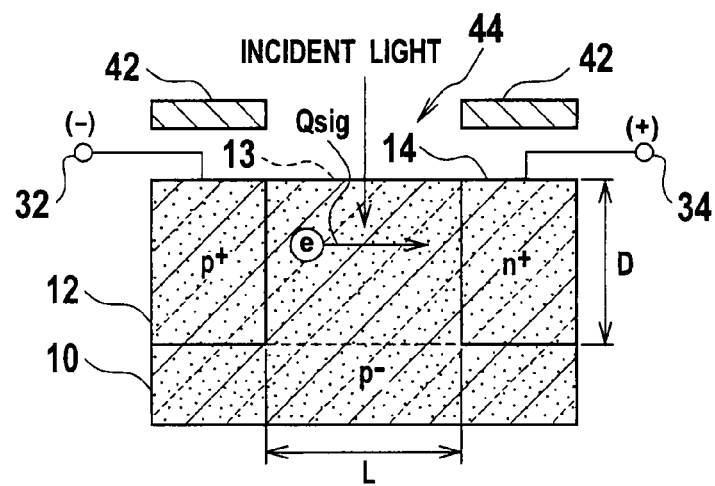
FIG. 4 is a cross sectional view of the avalanche photodiode shown in FIG. 3.

The avalanche photodiode APD according to the first embodiment includes a $p^+$-type anode region 12, a $p^-$-type avalanche multiplication region 13 and an $n^+$-type cathode region 14 in a semiconductor substrate 10, as shown in FIGS. 3, 4. An anode wiring 32 is connected to the anode region 12. A cathode wiring 34 is connected to the cathode region 14. A light shielding film 42 having an opening 44 corresponding to the avalanche multiplication region 13 is disposed above the avalanche photodiode.

The anode region 12 is buried in an upper portion of the semiconductor substrate 10, and extended in a direction orthogonal to a surface of the semiconductor substrate 10 from the surface of the semiconductor substrate 10. The cathode region 14 is buried in the upper portion of the semiconductor substrate 10 separated from the anode region 12 in a direction parallel to the surface of the semiconductor substrate 10. The avalanche multiplication region 13 is defined between the anode region 12 and the cathode region 14 which face each other. The anode region 12 and the cathode region 14 have substantially the same depth D. The avalanche multiplication region 13 has a length L between the anode region 12 and the cathode region 14.

An impurity concentration of the avalanche multiplication region 13 is less than that of the anode region 12 and the cathode region 14. For example, for the semiconductor substrate 10, a $p^-$-type Si substrate and the like is used. However, when the impurity concentration of the semiconductor substrate 10 is as low as described below, an $n^-$-type Si substrate may be used. The impurity concentration of the semiconductor substrate 10 is in a range between about $1\times10^{14}$ $cm^{-3}$ and about $5\times10^{15}$ $cm^{-3}$, desirably in a range between about $1\times10^{14}$ $cm^{-3}$ and about $2\times10^{15}$ $cm^{-3}$, and more desirably in a range between about $1\times10^{14}$ $cm^{-3}$ and about $1\times10^{15}$ $cm^{-3}$.

The impurity concentrations of the anode region 12 and the cathode region 14 are about $1\times10^{18}$ cm$^{-3}$ or more, desirably about $5\times10^{18}$ cm$^{-3}$ or more, and more desirably about $1\times10^{19}$ cm$^{-3}$ or more.

The avalanche photodiode is used in a reverse bias. For example, as shown in FIG. 2, a negative voltage (−VPD) is applied to the anode region 12 through the anode wiring 32, and a positive voltage is applied to the cathode region 14 through the cathode wiring 34. A light incident to the surface of the avalanche multiplication region 13 through the opening 44 of the light shielding film 42, is absorbed in the avalanche multiplication region 13 and generates electron-hole pairs. The generated electrons and holes move to the cathode region 14 and the anode region 12, respectively, due to an electric field generated by the reverse bias applied to the avalanche photodiode. The holes arriving at the anode region 12 are conducted to the anode wiring 32. On the other hand, the electrons arriving at the cathode region 14 are accumulated as a signal charge Qsig in the cathode region 14 and the source region of the transfer transistor Tr$_{TRF}$ connected to the cathode region 14.

Figure 5:
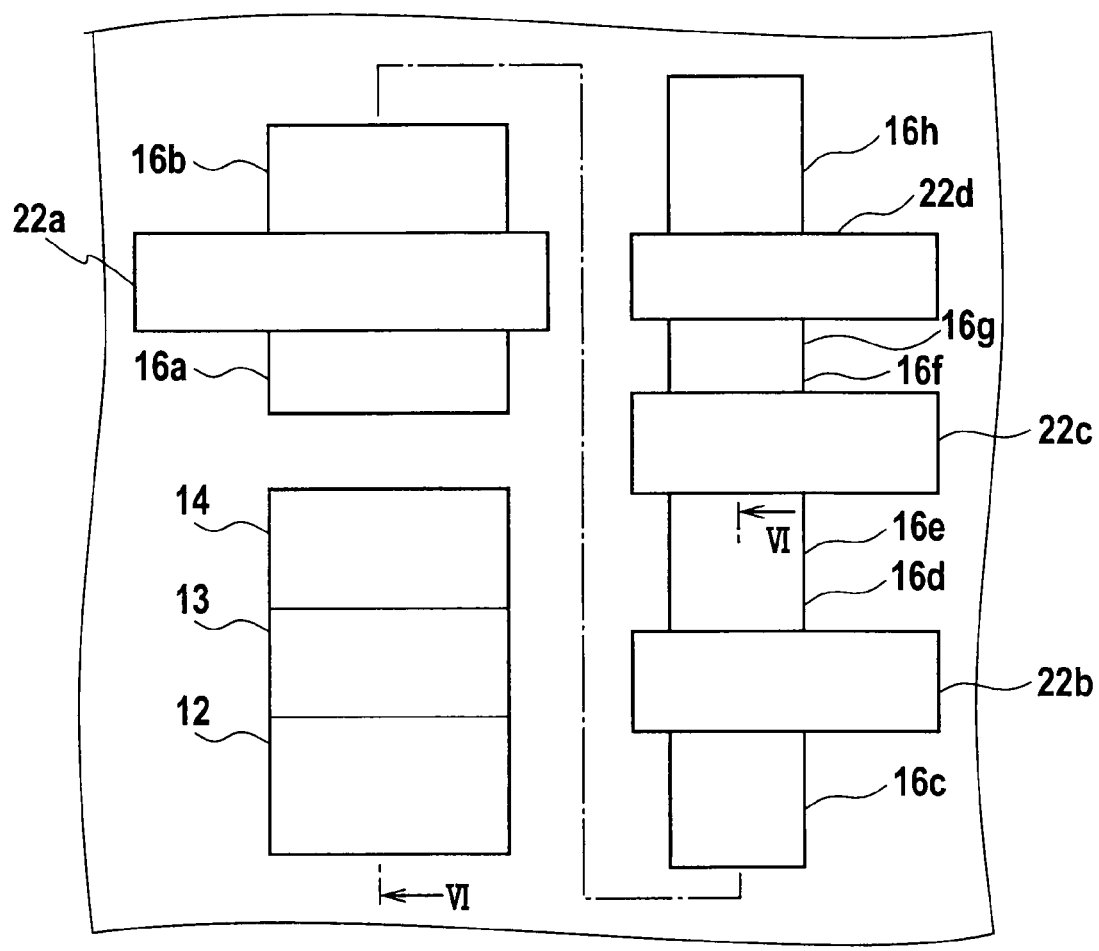
FIG. 5 is a schematic plan view showing an example of a cell of the image sensor according to the first embodiment of the present invention.

As shown in FIG. 5, the transfer transistor (16a, 22a, 16b) is disposed in a side of the cathode region 14 of the avalanche photodiode (12, 13, 14). The reset transistor (16c, 22b, 16d), the amplifying transistor (16e, 22c, 16f) and the selection transistor (16g, 22d, 16h) are disposed in parallel to the avalanche photodiode (12, 13, 14).

The drain region 16d of the reset transistor (16c, 22b, 16d) and the drain region 16e of the amplifying transistor (16e, 22c, 16f) are disposed in contact with each other. The source region 16f of the amplifying transistor (16e, 22c, 16f) and the drain region 16g of the selection transistor (16g, 22d, 16h) are disposed in contact with each other.

Figure 6:
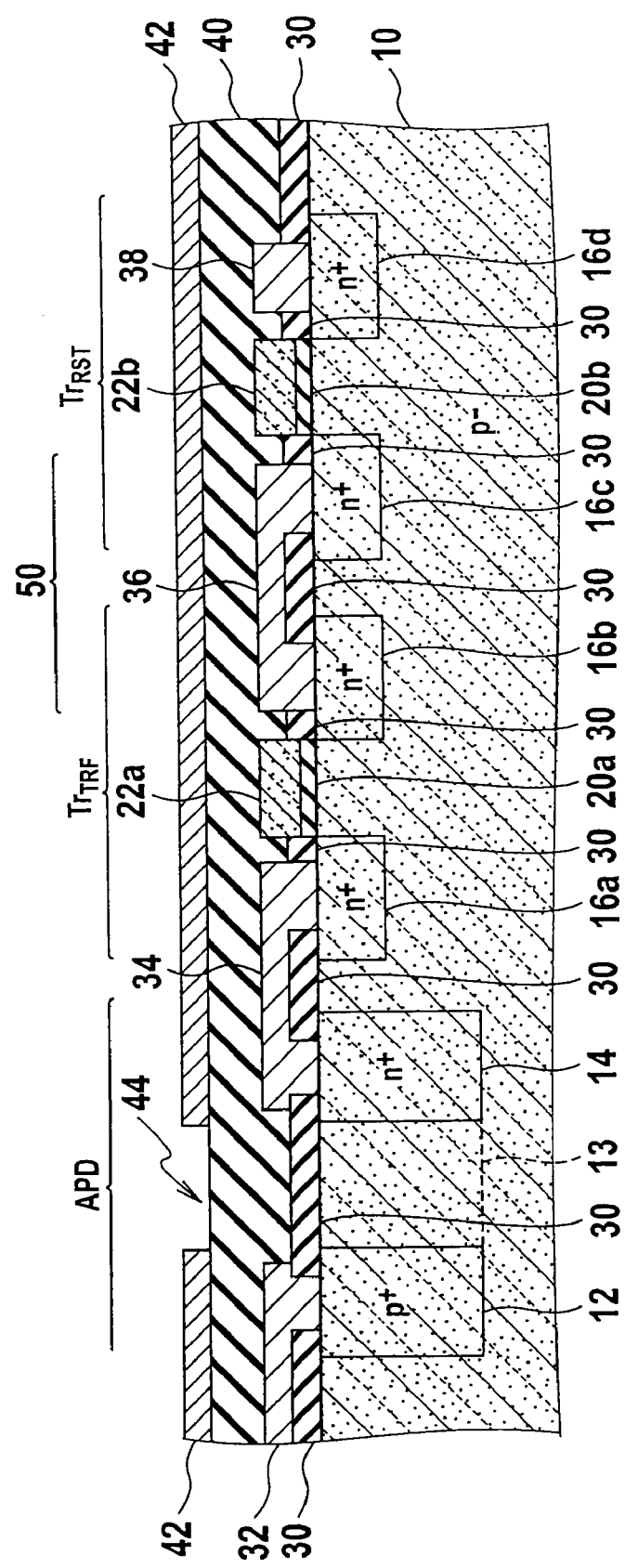
FIG. 6 is cross sectional view taken on line VI-VI of the cell shown in FIG. 5.

As shown in FIG. 6, each region for the avalanche photodiode (12, 13, 14), the transfer transistor (16a, 22a, 16b), the reset transistor (16c, 22b, 16d) and the like, is provided in the semiconductor substrate 10. A protective film 30, such as a silicon oxide (SiO$_2$) film and the like, is provided on the surface of the semiconductor substrate 10. The anode wiring 32 is connected to the anode region 12 through the opening of the protective film 30. Similarly, the cathode wiring 34 is connected to the cathode region 14 of the avalanche photodiode (12, 13, 14) and the source region 16a of the transfer transistor (16a, 22a, 16b). A wiring 36 is connected to the drain region 16b of the transfer transistor (16a, 22a, 16b) and the source region 16c of the reset transistor (16c, 22b, 16d). A power source voltage wiring 38 is connected to the drain region 16d of the reset transistor (16c, 22b, 16d). The drain region 16b of the transfer transistor (16a, 22a, 16b) and the source region 16c of the reset transistor (16c, 22b, 16d) are used as the FD of the sensing portion 50.

A gate insulating film 20a and a gate electrode 22a are provided in the gate of the transfer transistor (16a, 22a, 16b). A gate insulation film 20b and a gate electrode 22b are provided in the gate of the reset transistor (16c, 22b, 16d). The light shielding film 42, such as an aluminum (Al) film and the like, is provided in contact with an insulating film 40 above the wirings (32, 34, 36, 38) and the gate electrodes (22a, 22b). The opening 44 is provided in the light shielding film 42, corresponding to the avalanche multiplication region 13.

In addition, although not shown in the drawings, the wiring 36 is connected to the gate electrode 22c of the amplifying transistor (16e, 22c, 16f). The gate electrode 22a of the transfer transistor (16a, 22a, 16b) is connected to the transfer signal line. The gate electrode 22b of the reset transistor (16c, 22b, 16d) is connected to the reset signal line. The gate electrode 22d of the selection transistor (16g, 22d, 16h) is connected to the row selection signal line. The source region 16h of the selection transistor (16g, 22d, 16h) is connected to the vertical signal line connected to the CDS circuit 64 shown in FIG. 1.

The transfer of the signal charges in the image sensor according to the first embodiment will be described by using a potential diagram shown in FIG. 7, through a path from the avalanche photodiode (12, 13, 14) to the reset transistor (16c, 22b, 16d) shown in FIG. 6.

Figure 7:
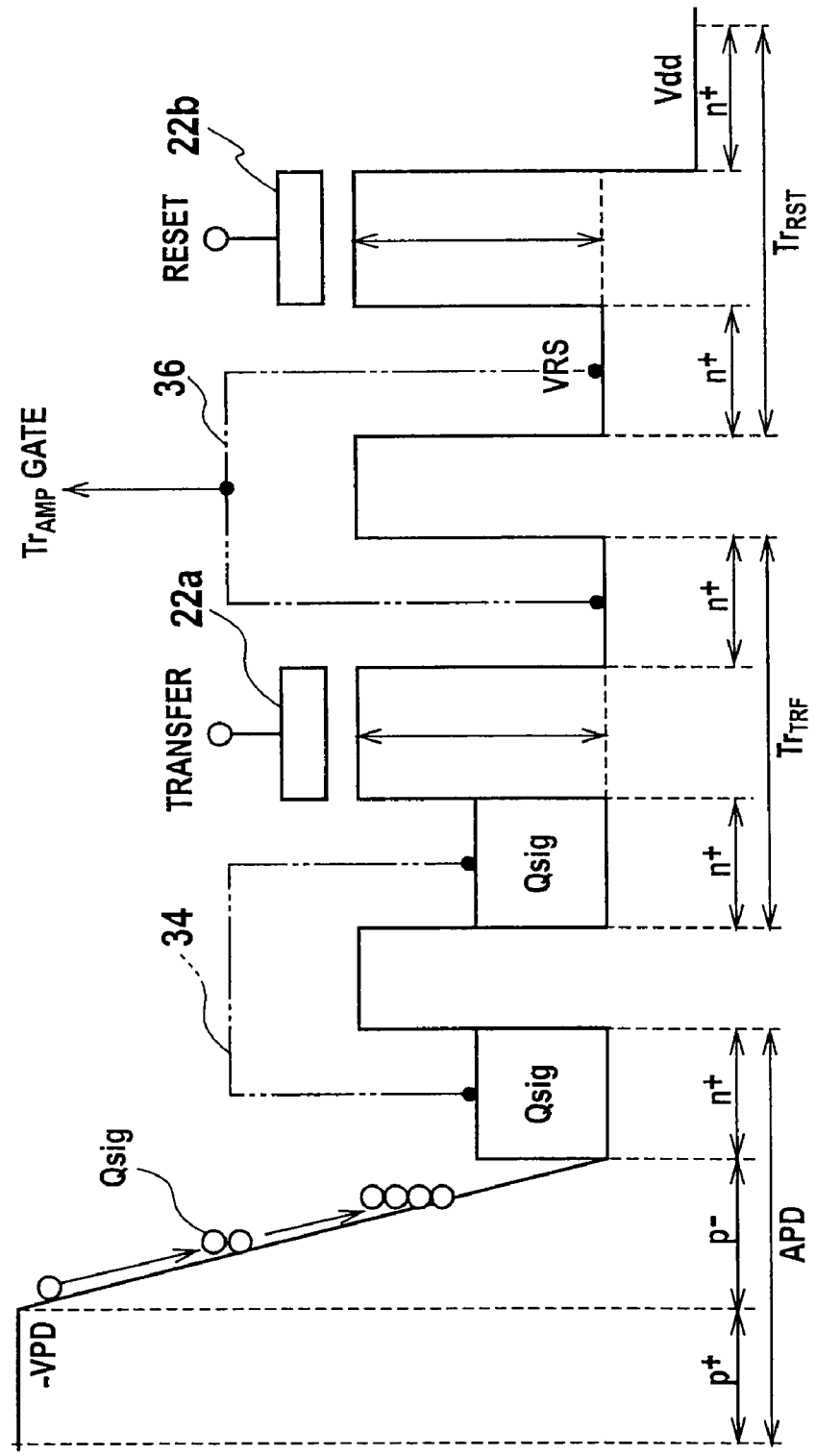
FIG. 7 is an example of a potential diagram of the cell shown in FIG. 6.

In FIG. 7, with respect to electric potentials below the gate electrode 22a of the transfer transistor Tr$_{TRF}$ and the gate electrode 22b of the reset transistor Tr$_{RST}$, two potential states corresponding to on and off operations of the transistor are represented by arrows.

At first, a transfer signal and a reset signal are applied to the gate electrode 22a of the transfer transistor Tr$_{TRF}$ and the gate electrode 22b of the reset transistor Tr$_{RST}$, respectively, and the transfer transistor Tr$_{TRF}$ and the reset transistor Tr$_{RST}$ are turned on. As a result, each electric potential of the sensing portion 50, the source region 16a of the transfer transistor Tr$_{TRF}$ and the cathode region 14 is reset to a reset voltage VRS.

After that, when the transfer transistor Tr$_{TRF}$ is turned off, signal charge accumulation starts. At this time, since the voltage of the anode region 12 of the avalanche photodiode APD is (−VPD), a reverse bias voltage (−VPD−VRS) is applied to the avalanche photodiode APD. Most of the reverse bias voltage (−VPD−VRS) is applied to the p$^-$-type avalanche multiplication region 13 that has a low impurity concentration, so as to generate an electric field in the avalanche multiplication region 13.

The incident light, transmitting into the avalanche multiplication region 13 through the opening 44, is absorbed by the avalanche multiplication region 13 and generates electron-hole pairs. The generated signal electrons are moved to the cathode region 14 by the electric field generated by the applied reverse bias. The signal electrons (Qsig) arriving at the cathode region 14 are accumulated in the cathode region 14 and in the source region 16a of the transfer transistor Tr$_{TRF}$ connected through the wiring 34 to the cathode region 14.

At this time, by sufficiently increasing the electric field of the avalanche multiplication region 13, avalanche multiplication of the electrons and holes occurs in the avalanche multiplication region 13. In a single crystal Si, which is a typical semiconductor substrate material, avalanche multiplication preferentially occurs by electrons having relatively higher ionization rate α than holes (refer to C. A. Lee, et al., Physical Review, 1964, Vol. 134, No. 3A, p. A761).

Figure 8:
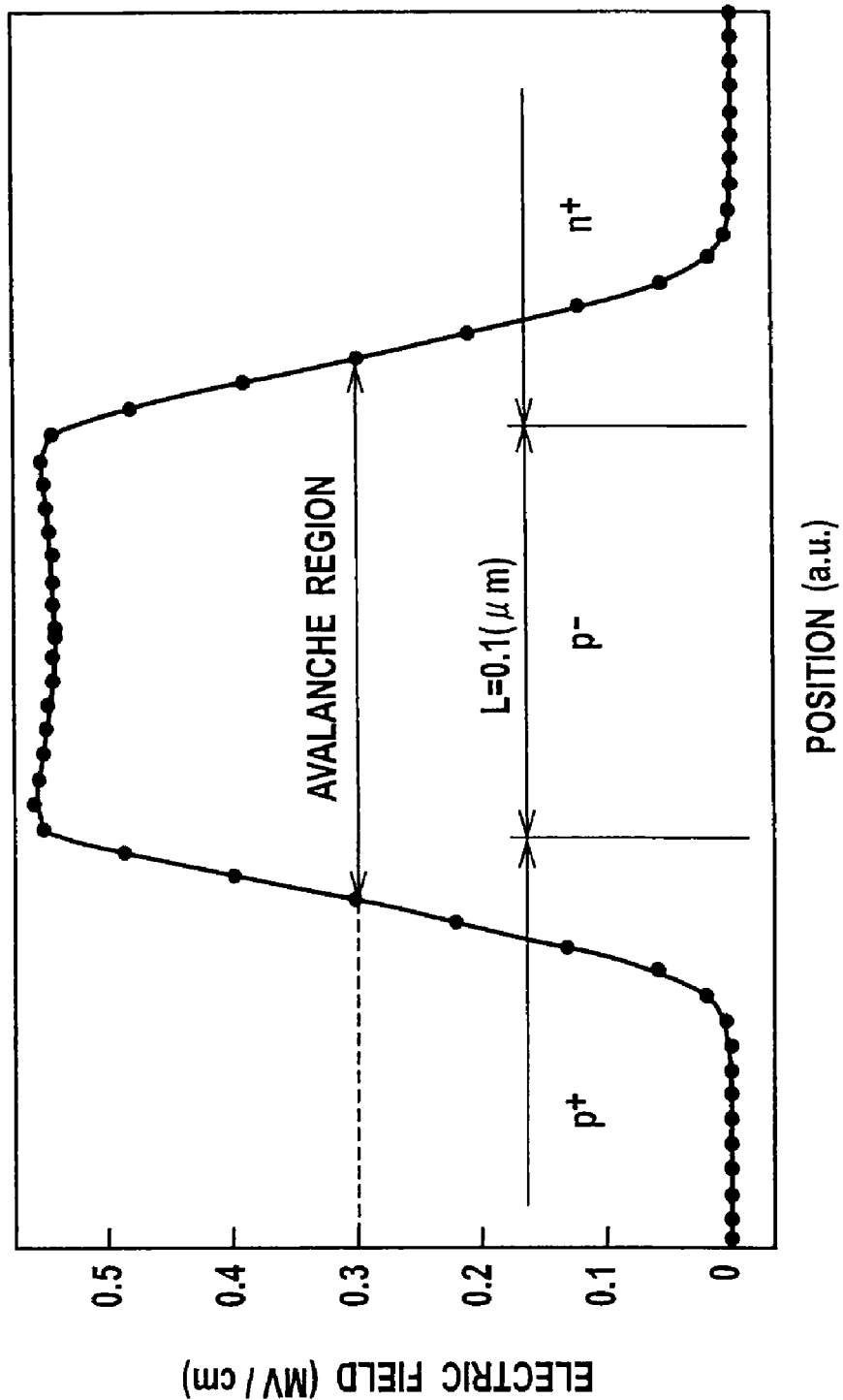
FIG. 8 is a diagram showing an example of an electric field distribution in the avalanche photodiode according to the first embodiment of the present invention.

For example, when the length L of the avalanche multiplication region 13 shown in FIG. 4 is about 0.1 μm and the reverse bias voltage (−VPD−VRS) is about −6.6 V, an electric field of about $5.5\times10^5$ V/cm is generated in the avalanche multiplication region 13, as shown in FIG. 8. The ionization rate α of the electrons in the single crystal Si with an electric field intensity of about $5.5\times10^5$ V/cm is about $1.26\times10^5$ cm$^{-1}$. Here, the avalanche multiplication factor M is M=exp(αL). Therefore, the avalanche multiplication factor M is provided as follows.

$$M=\exp(1.26\times10^5\times0.1\times10^{-4})=3.5 \quad (1)$$

Thus, it is understood that an avalanche multiplication of about 3.5 times can be obtained.

Here, as the reverse bias voltage (−VPD−VRS), the reset voltage VRS is set to about 3.3 V, and the anode voltage (−VPD) is set to about −3.3 V. When the length L of the avalanche multiplication region 13 is enlarged, the negative value of the anode voltage (−VPD) may be increased, in order to ensure the electric field intensity of the avalanche multiplication region 13. In this way, without changing the reset voltage VRS for a reading circuit, such as the amplifying transistor and the like, it is possible to ensure the avalanche multiplication factor M.

For example, when the length L of the avalanche multiplication region 13 is about 0.2 μm, the reset voltage VRS and the anode voltage (−VPD) may be set to about 3.3 V and about −6.7 V, respectively. The electric field, generated in the avalanche multiplication region 13, of about $4.4 \times 10^5$ V/cm, and the ionization rate α of the electrons of about $7.94 \times 10^4$ cm$^{-1}$ may be provided. At this time, the avalanche multiplication factor M is provided as follows.

$$M = \exp(7.94 \times 10^4 \times 0.2 \times 10^{-4}) = 4.9 \qquad (2)$$

Thus, it is understood that an avalanche multiplication of about 4.9 times can be obtained.

Readout of the signal charge Qsig accumulated in the cathode region 14 and the source region 16a of the transfer transistor Tr$_{TRF}$ is similar to that of the usual MOS image sensor. For example, when the transfer transistor Tr$_{TRF}$ is turned on, the signal charge Qsig is transferred to the sensing portion 50. As a result, the gate potential of the amplifying transistor Tr$_{AMP}$ is modulated so as to generate an analog voltage signal corresponding to the signal charges Qsig in the gate of the amplifying transistor Tr$_{AMP}$. The generated analog voltage signal is read by the source follower circuit in each row.

In addition, prior to the readout of the signal by the amplifying transistor Tr$_{AMP}$, it is more desirable to reset the voltage of the sensing portion 50 by applying the reset signal to the gate electrode 22b of the reset transistor Tr$_{RST}$. In this case, by using a difference between the analog voltage signal read in the reset state and the analog voltage signal read after the signal charge Qsig is transferred to the sensing portion 50, it is possible to remove a reset noise component and to reduce the noise of the analog voltage signal.

In the first embodiment, an electric field sufficient to generate avalanche multiplication in the direction parallel to the semiconductor substrate surface is generated in the avalanche multiplication region 13 of the avalanche photodiode. Therefore, it is possible to multiply the signal charge Qsig generated by the incident light in the avalanche multiplication region 13, and to achieve an image sensor having high sensitivity.

In the usual image sensor, the direction of the incident light is parallel to the direction of the electric field for the avalanche multiplication. Therefore, there is a problem in that the multiplication factor is different depending on a wavelength of the incident light. That is, an absorption coefficient of a semiconductor film, such as Si, is high for a short wavelength incident light, so that the incident light is absorbed in the vicinity of the surface of the semiconductor film. Conversely, since the absorption coefficient of the semiconductor film is low for a long wavelength incident light, the incident light is absorbed even in the deep region of the semiconductor film. Thus, the average travel distance of the signal electrons does not coincide with a length of a region in which the avalanche multiplication electric field is generated. Hence, in the case of a long wavelength light, it is impossible to achieve a sufficient multiplication factor. Therefore, the spectral sensitivity characteristic may be changed.

In the first embodiment, in the avalanche multiplication region 13 of the avalanche photodiode, an electric field sufficient to generate the avalanche multiplication is generated in a direction substantially orthogonal to the incident direction of the incident light. Thus, the avalanche multiplication factor in the avalanche multiplication region 13 is constant, independent of the wavelength of the incident light. As a result, it is possible to suppress a change in the spectral sensitivity characteristic.

As a method of manufacturing an image sensor according to the first embodiment, it is possible to use the general manufacturing processes used in the manufacture of a MOS transistor. As a method of forming high concentration impurity regions as the anode and cathode regions of the avalanche photodiode, for example, ion implantation and the like may be used. Also, it is possible to use a method of embedding an amorphous material or a poly-crystal material and the like to dope a p-type or n-type impurity in trenches formed by etching regions of the semiconductor substrate, in which the anode and cathode regions are formed. In this case, it is desirable to implement moderate annealing, as necessary, to crystallize the embedded amorphous material or poly-crystal material.

Figure 9:
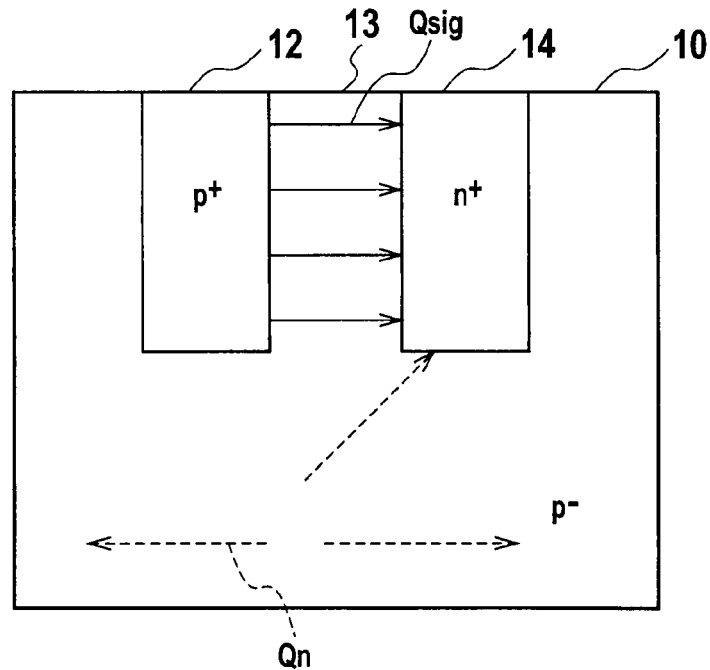
FIG. 9 is a cross sectional view showing an example of the avalanche photodiode according to the first embodiment of the present invention.

In addition, in the foregoing explanation, as shown in FIG. 9, the depths of the anode region 12 and the cathode region 14 are substantially equal. In this case, the signal electrons generated by the incident light absorbed in a region shallower than the anode region 12 and the cathode region 14 in the avalanche multiplication region are multiplied by avalanche multiplication and accumulated in the cathode region 14 (Qsig).

On the other hand, for electrons Qn generated by the incident light absorbed in a region of the semiconductor substrate 10 deeper than the avalanche multiplication region 13, a part of the electrons Qn is accumulated in the cathode region 14. Since the electrons Qn are not multiplied by avalanche multiplication, contribution to the signal charge can be ignored. The electrons Qn, which are not accumulated in the cathode region 14, may diffuse in the semiconductor substrate 10. With respect to the image sensor, the electrons Qn diffusing in the semiconductor substrate 10, as mentioned above, may be caught up in the adjacent pixels and generate a cross talk. More specifically, a so-called color mixture may be generated. Thus, it is necessary to take a countermeasure against such occurrence.

Figure 10:
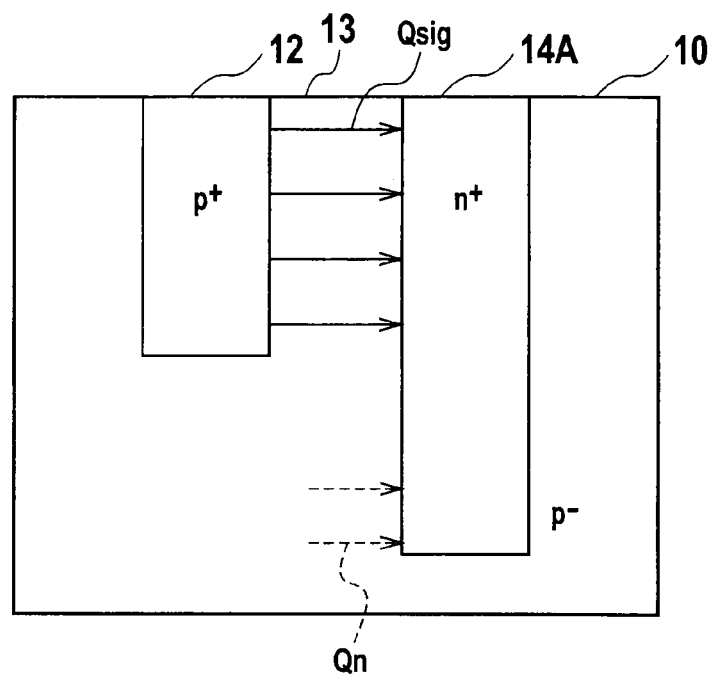
FIG. 10 is a cross sectional view showing another example of the avalanche photodiode according to the first embodiment of the present invention.

As shown in FIG. 10, the depth of a cathode region 14A is provided deeper than an anode region 12. In this case, with regard to electrons Qn, generated in a region deeper than the avalanche multiplication region 13 defined by the depth of the anode region 12, a majority of the electrons Qn are accumulated in the cathode region 14A in a portion deeper than the anode region 12. Thus, it is possible to considerably decrease the electrons that diffuse in the semiconductor substrate 10 and cause the color mixture.

Second Embodiment

Figure 11:
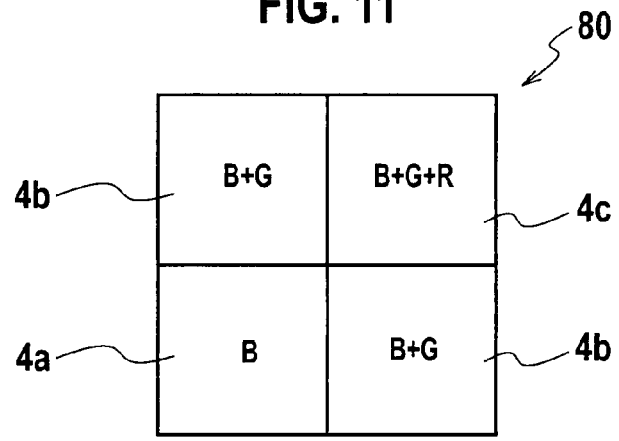
FIG. 11 is a schematic view showing an example of a cell of a single-plate color image sensor according to a second embodiment of the present invention.

A single-plate color image sensor according to a second embodiment of the present invention includes a cell 80 in which four pixels 4a, 4b and 4c are arranged as a Bayer array, as shown in FIG. 11. The pixel 4a is used for blue color (B). Two pixels 4b are used for blue and green colors (B+G). The pixel 4c is used for blue, green and red color (B+G+R).

Figure 12:
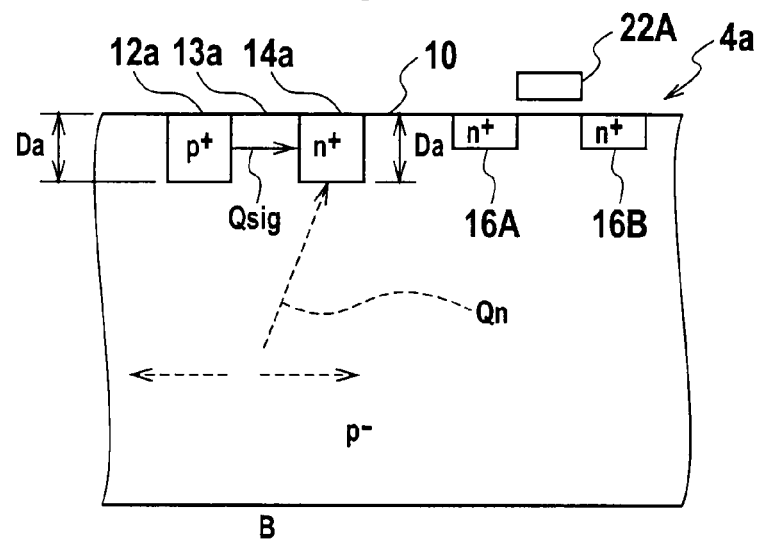
FIGS. 12-14 are cross sectional views showing examples of avalanche photodiodes according to the second embodiment of the present invention.

The pixel 4a includes a first avalanche photodiode (12a, 13a and 14a) and a first transfer transistor (16A, 22A and 16B), as shown in FIG. 12. The first avalanche photodiode (12a, 13a and 14a) includes a first anode region 12a, a first avalanche multiplication region 13a and a first cathode region 14a. The first anode region 12a and the first cathode region 14a have substantially the same depth Da. The first transfer transistor (16A, 22A and 16B) includes a first source region 16A, a first gate electrode 22A and a first drain region 16B.

The first source region 16A is electrically connected to the first cathode region 14a through a wiring (not shown).

Figure 13:
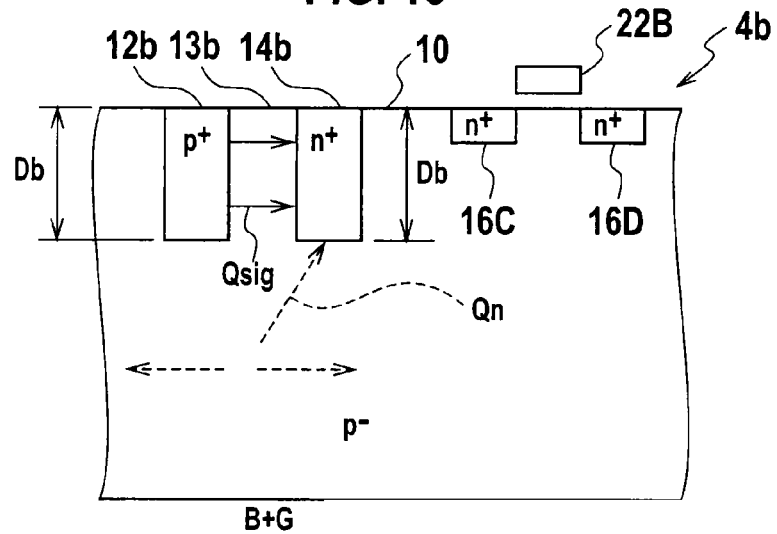

The pixel 4b includes a second avalanche photodiode (12b, 13b and 14b) and a second transfer transistor (16C, 22B and 16D), as shown in FIG. 13. The second avalanche photodiode (12b, 13b and 14b) includes a second anode region 12b, a second avalanche multiplication region 13b and a second cathode region 14b. The second anode region 12b and the second cathode region 14b have substantially the same depth Db. The second transfer transistor (16C, 22B and 16D) includes a second source region 16C, a second gate electrode 22B and a second drain region 16D. The second source region 16C is electrically connected to the second cathode region 14b through a wiring (not shown).

Figure 14:
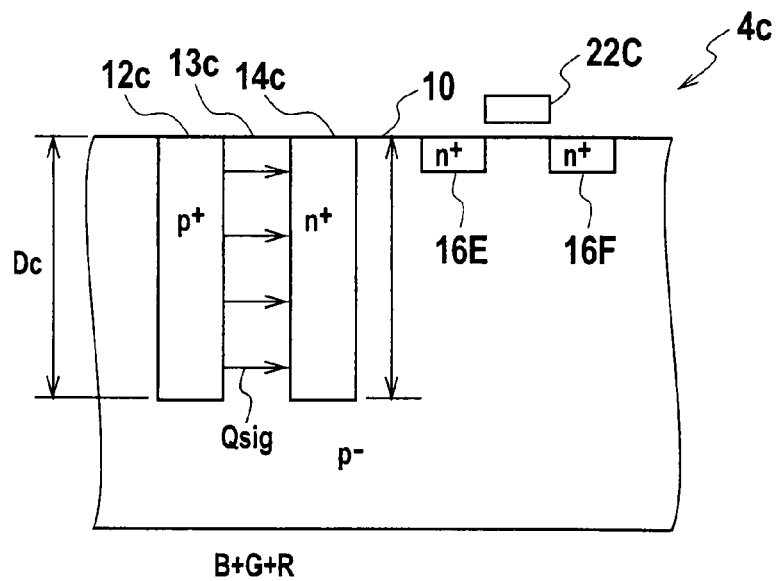

The pixel 4c includes a third avalanche photodiode (12c, 13c and 14c) and a third transfer transistor (16E, 22C and 16F), as shown in FIG. 14. The third avalanche photodiode (12c, 13c and 14c) includes a third anode region 12c, a third avalanche multiplication region 13c and a third cathode region 14c. The third anode region 12c and the third cathode region 14c have substantially the same depth Dc. The third transfer transistor (16E, 22C and 16F) includes a third source region 16E, a third gate electrode 22C and a third drain region 16F. The third source region 16E is electrically connected to the third cathode region 14c through a wiring (not shown).

A reset transistor, an amplifying transistor, a selection transistor and the like may be provided in each of the pixels 4a, 4b, 4c. However, such transistors may be shared by the pixels 4a, 4b, 4c to reduce pixel circuit scale.

The depths Da, Db and Dc of the pixels 4a, 4b and 4c have a relation of Da<Db<Dc. As mentioned above, the short wavelength light is absorbed in the vicinity of the surface of the semiconductor layer, and the long wavelength light is transmitted to be absorbed in the deeper portion of the semiconductor layer. Thus, in the first avalanche multiplication region 13a of the pixel 4a, the blue light is mainly absorbed to generate the signal electrons Qsig. In the second avalanche multiplication region 13b of the pixel 4b, the blue and green lights are mainly absorbed to generate the signal electrons Qsig. In the third avalanche multiplication region 13c of the pixel 4c, the blue, green and red lights are mainly absorbed to generate the signal electrons Qsig. In this way, by changing the depths Da, Db and Dc of the first to third anode regions 12a, 12b and 12c and the first to third cathode regions 14a, 14b and 14c, it is possible to arbitrarily design a spectral absorption characteristic of each of the first to third avalanche photodiodes.

The second embodiment differs from the first embodiment in that the plurality of pixels 4a, 4b and 4c, in which the depths Da, Db and Dc of the first to third anode regions 12a, 12b and 12c and the first to third cathode regions 14a, 14b and 14c are different, are arrayed in the cell 80. Other configurations are the same as in the first embodiment, and thus duplicated descriptions are omitted.

Figure 15:
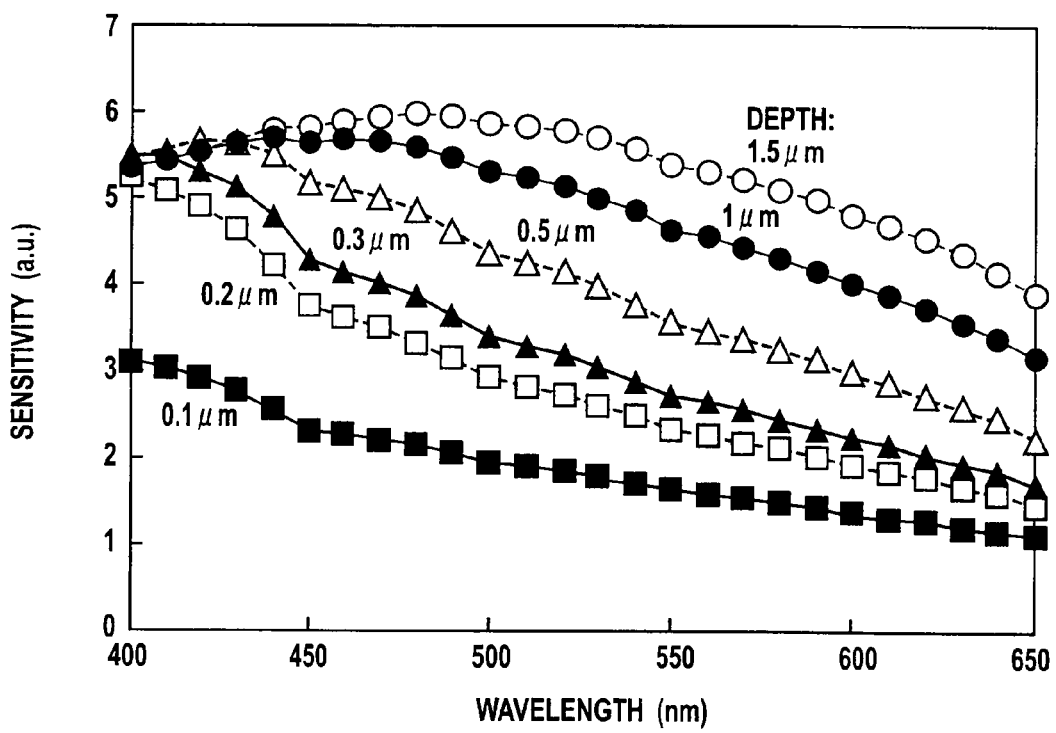
FIG. 15 is a diagram showing an example of a relation of sensitivity and wavelength of the avalanche photodiode according to the second embodiment of the present invention.

FIG. 15 shows the relationship between the sensitivity of the avalanche photodiode and the wavelength of the incident light due to changing the depths of the anode region and the cathode region. From FIG. 15, when the depths of the anode and cathode regions are in a range between about 0.1 μm and 0.3 μm, desirably in a range between about 0.2 μm and 0.3 μm, it is possible to provide an avalanche photodiode having relatively higher sensitivity in a range between about 400 nm and 450 nm, which is the wavelength range of the blue color, than the other wavelength bands. When the depths of the anode and cathode regions are in a range of more than about 0.1 μm and less than about 0.3 μm, it is possible to provide an avalanche photodiode having relatively higher sensitivity in a range between about 400 nm and 550 nm, which is the wavelength range of the blue to green colors. When the depths of the anode and cathode regions are equal to or deeper than about 1 μm, it is possible to provide an avalanche photodiode having relatively higher sensitivity in a range between about 400 nm and 650 nm, which is the wavelength range of the blue to red colors.

Figure 16:
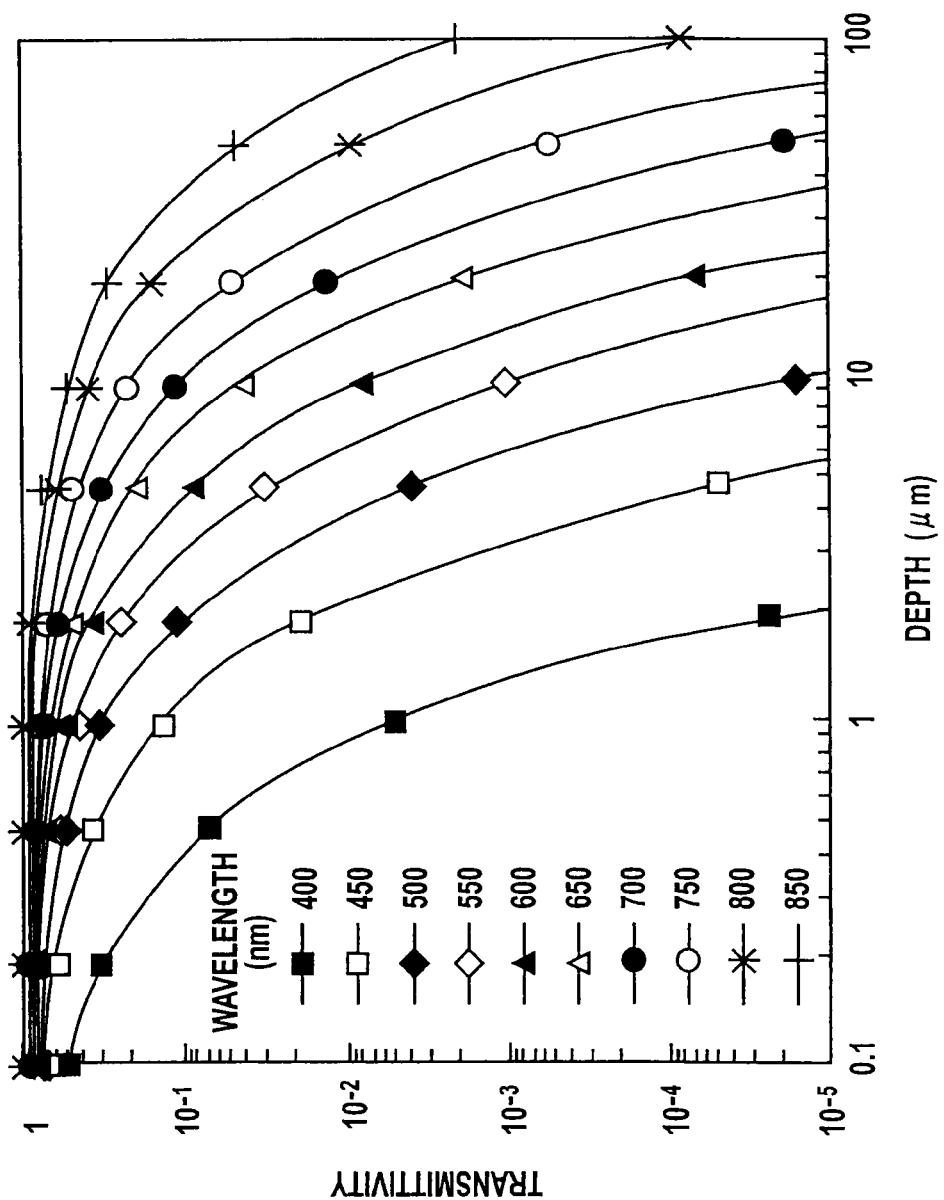
FIG. 16 is a diagram showing an example of a relation of transmittivity and depth of a semiconductor layer used in an explanation of the second embodiment of the present invention.

FIG. 16 shows the relationship between transmittivity and depth of the single crystal Si semiconductor layer due to changing the wavelength of the incident light. For example, targets for imaging are assumed to have a long wavelength light having a wavelength of about 650 nm. Even for a single wavelength light of about 650 nm, about 97% of the light is absorbed in the Si semiconductor layer within a depth of about 10 μm. Thus, when the depths of the anode and cathode regions are in the range between about 1 μm and about 10 μm, it is possible to achieve an avalanche photodiode having high sensitivity in the wavelength range of the blue to red colors.

Also, in order to ensure high sensitivity in the wavelength range of the blue to green colors, more desirably, the depths of the anode and cathode regions may be in a range between about 0.3 μm and about 1.5 μm. In this case, the sensitivity for the light in the wavelength range between about 500 nm and about 550 nm that defines the green color is increased, as shown in FIG. 15.

Moreover, in order to ensure high sensitivity in the wavelength range of the blue to red lights, more desirably, the depths of the anode and cathode regions may be in a range between about 1.5 μm and about 5 μm. In this case, as shown in FIG. 16, even in the long wavelength light of about 650 nm, about 80% of the light is absorbed in a depth of about 5 μm. Thus, it is possible to achieve sufficient sensitivity for the long wavelength light. Also, since the depths of the anode and cathode regions are shallow, it is possible to easily implement the manufacturing processes.

The first to third avalanche photodiodes, in which the depths of the first to third anode regions and the first to third cathode regions are respectively different, are repeatedly arranged in the imaging area. Thus, it is possible to achieve a single-plate color image sensor. The above-mentioned single-plate color image sensor has three kinds of output signals, such as (R+G+B), (G+B) and B, which are different from the R, G and B output signals of the usual primary color filter image sensor. In this case, by applying proper arithmetic processing to the three kinds of signals, it is possible to provide the R, G and B signals.

In this way, according to the second embodiment, it is possible to achieve a single-plate color image sensor without a color filter. Since the color filter is not used, it is possible to greatly decrease the distance between a surface of the avalanche photodiode and a micro lens for improving an optical numerical aperture of the pixel. Thus, it is possible to improve the light collection efficiency through the micro lens, and to achieve a single-plate color image sensor having high sensitivity at a low cost.

Further, as shown in FIGS. 12, 13, in the pixels 4a, 4b in which the depths of the first and second anode regions 12a, 12b and the first and second cathode regions 14a, 14b are shallow, the electrons Qn, generated in a portion of the semiconductor substrate 10 deeper than the first and second avalanche multiplication regions 13a, 13b, cause color mixing. As a structure for protecting against the color mixture, as shown in FIGS. 17 to 19, the first to third cathode regions 14a, 14b and 14c at the depth Dc may be used for the pixels 4a, 4b and 4c.

Figure 17:
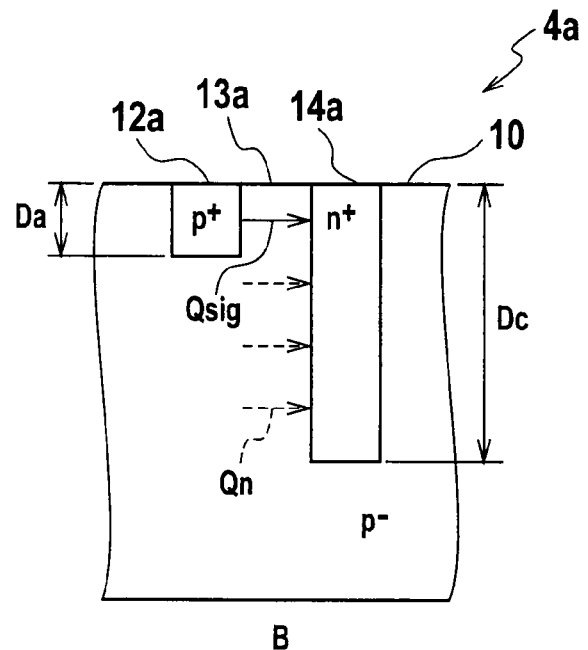
FIGS. 17-19 are cross sectional views showing another examples of avalanche photodiodes according to the second embodiment of the present invention.
Figure 18:
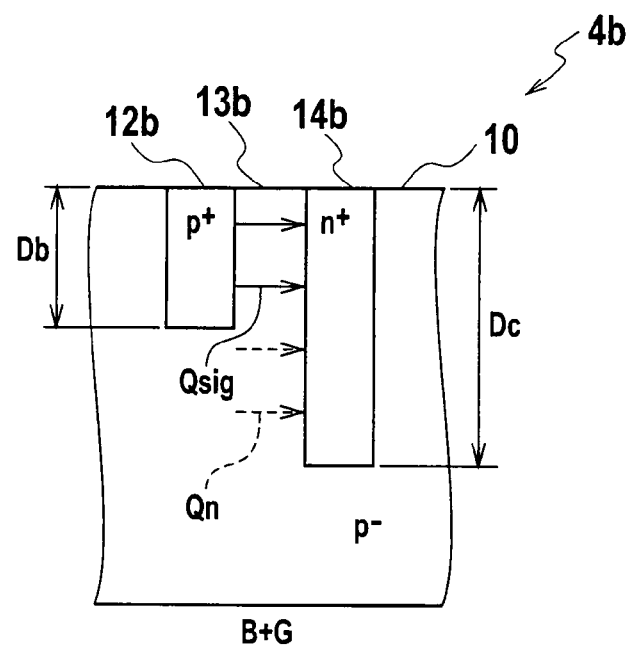
Figure 19:
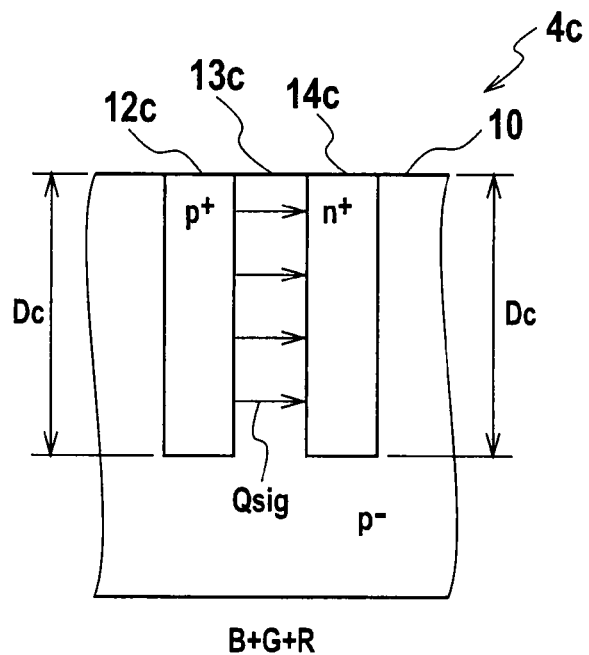

As shown in FIGS. 17 and 18, the first and second avalanche multiplication regions 13a, 13b in the pixels 4a, 4b are defined in accordance with the depths Da, Db of the first and second anode regions 12a, 12b, respectively. Most of the electrons Qn generated in the portion deeper than the first and second avalanche multiplication regions 13a, 13b are accumulated in the first and second cathode regions 14a, 14b. Thus, the electrons, which diffuse in the semiconductor substrate and cause the color mixture (mixing), can be considerably decreased. The electrons Qn generated in the region deeper than the first and second avalanche multiplication regions 13a, 13b are not multiplied by the avalanche multiplication. Hence, the contribution to the signal charges can be ignored.

According to the second embodiment, it is possible to achieve a single-plate color image sensor to suppress a decrease of sensitivity and the change of spectral sensitivity.

Other Embodiments

The present invention has been described as mentioned above. However the descriptions and drawings that constitute a portion of this disclosure should not be perceived as limiting this invention. Various alternative embodiments and operational techniques will become clear to persons skilled in the art from this disclosure.

The first and second embodiments of the present invention are explained by using the MOS readout circuit. However, the type of readout is not limited to the MOS readout circuit, and may be a CCD readout circuit.

Figure 20:
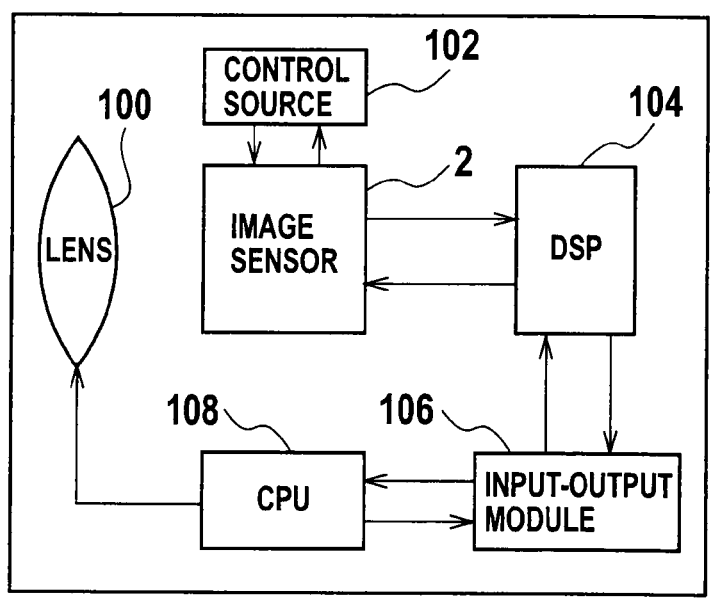
FIG. 20 is a schematic view showing an example of an electronic device according to other embodiments of the present invention.

The image sensor according to the first and second embodiments of the present invention can be used in a camera module of an electronic device, such as a portable telephone, a digital camera and the like. As shown in FIG. 20, the camera module includes an image sensor 2, a lens 100, a control source 102, a digital signal processor (DSP) 104, an input-output module 106, a central processing unit (CPU) 108 and the like. An image of an object formed on the image sensor 2 through the lens 100 is converted by photoelectric conversion in the image sensor 2. The converted image signal is subjected to signal processing by the DSP 104 and transmitted from the input-output module 106. The CPU 108 controls an optical system including the lens 100. The control source 102 supplies a voltage applied to the image sensor 2.

In addition, the camera module may be provided by the image sensor 2, the lens 100, the DSP 104 and the input-output 106. Moreover, the camera module may be provided only by the image sensor 2, the lens 100 and the input-output unit 106.

In the electronic device, in which the image sensor or the single-plate color image sensor according to the first and second embodiments of the present invention is installed, it is possible to achieve an electronic device having high sensitivity and with low cost.

Various modifications will become possible for those skilled in the art after storing the teachings of the present disclosure without departing from the scope thereof.

What is claimed is:

1. A single-plate color image sensor, comprising:
an imaging area including a plurality of cells arrayed in a matrix on a semiconductor substrate, each of the cells including first to third avalanche photodiodes, each of the first to third avalanche photodiodes respectively including:
first to third anode regions buried in an upper portion of the semiconductor substrate;
first to third cathode regions buried in the upper portion of the semiconductor substrate separated from each of the first to third anode regions in a direction parallel to the surface of the semiconductor substrate; and
first to third avalanche multiplication regions defined between each of the first to third anode regions and each of the first to third cathode regions, each of the first to third avalanche multiplication regions having an impurity concentration less than each of the first to third anode regions and each of the first to third cathode regions;
wherein, for at least one of the first to third avalanche photodiodes, depths of each of the first to third anode regions and each of the first to third cathode regions from the surface of the semiconductor substrate are different from each other.

2. The color image sensor of claim 1, wherein the depth of the first to third cathode regions are deeper than the first to third anode regions, respectively.

3. The color image sensor of claim 2, wherein the depth of the first anode region is in a range of about 0.1 μm and about 0.3 μm, the depth of the second anode region is in a range of about 0.3 μm and about 1 μm, and the depth of the third anode region is in a range of about 1 μm and about 10 μm.

4. The color image sensor of claim 2, wherein the depth of the first anode region is in a range of about 0.1 μm and about 0.3 μm, the depth of the second anode region is in a range of about 0.3 μm and about 1.5 μm, and the depth of the third anode region is in a range of about 1.5 μm and about 5 μm.

5. The color image sensor of claim 1, each of the cells further comprising:
first to third insulated-gate field effect transistors having first to third source regions and first to third drain regions, the first to third source regions electrically connected to the first to third cathode regions, respectively, each of the first to third insulated-gate field effect transistors configured to transfer a signal charge generated by an incident light on each surface of the first to third avalanche multiplication regions to the first to third drain regions, respectively.

6. The color image sensor of claim 1, wherein the semiconductor substrate includes:
an automatic gain control circuit configured to adjust a gain of an analog signal converted from a signal charge, the signal charge generated by an incident light on a surface of the avalanche multiplication region;
an analog-digital converter configured to convert the adjusted gain analog signal to a digital signal; and
a timing generator configured to generate a clock signal synchronizing a timing of the automatic gain control circuit and the analog-digital converter to select a target cell among the cells.

7. An electronic device having a camera module in which a single-plate color image sensor is installed, the single-plate color image sensor comprising:
an imaging area including a plurality of cells arrayed in a matrix on a semiconductor substrate, each of the cells including first to third avalanche photodiodes, each of the first to third avalanche photodiodes respectively including:
first to third anode regions buried in an upper portion of the semiconductor substrate;
first to third cathode regions buried in the upper portion of the semiconductor substrate separated from each of the first to third anode regions in a direction parallel to the surface of the semiconductor substrate; and
first to third avalanche multiplication regions defined between each of the first to third anode regions and each of the first to third cathode regions, each of the first to third avalanche multiplication regions having an impurity concentration less than each of the first to third anode regions and each of the first to third cathode regions;

wherein, for at least one of the first to third avalanche photodiodes, depths of each of the first to third anode regions and each of the first to third cathode regions from the surface of the semiconductor substrate are different from each other.

8. The electronic device of claim 7, wherein the depth of the first to third cathode regions are deeper than the first to third anode regions, respectively.

9. The electronic device of claim 8, wherein the depth of the first anode region is in a range of about 0.1 μm and about 0.3 μm, the depth of the second anode region is in a range of about 0.3 μm and about 1 μm, and the depth of the third anode region is in a range of about 1 μm and about 10 μm.

10. The electronic device of claim 8, wherein the depth of the first anode region is in a range of about 0.1 μm and about 0.3 μm, the depth of the second anode region is in a range of about 0.3 μm and about 1.5 μm, and the depth of the third anode region is in a range of about 1.5 μm and about 5 μm.

11. The electronic device of claim 7, each of the cells further comprising:

first to third insulated-gate field effect transistors having first to third source regions and first to third drain regions, the first to third source regions electrically connected to the first to third cathode regions, respectively, each of the first to third insulated-gate field effect transistors configured to transfer a signal charge, generated by an incident light on each surface of the first to third avalanche multiplication regions, to the first to third drain regions, respectively.

12. The electronic device of claim 7, wherein the semiconductor substrate includes:

an automatic gain control circuit configured to adjust a gain of an analog signal converted from a signal charge, the signal charge generated by an incident light on a surface of the avalanche multiplication region;

an analog-digital converter configured to convert the adjusted gain analog signal to a digital signal; and a timing generator configured to generate a clock signal synchronizing a timing of the automatic gain control circuit and the analog-digital converter to select a target cell among the cells.

* * * * *